US012770824B2

(12) United States Patent
Satoh et al.

(10) Patent No.: US 12,770,824 B2
(45) Date of Patent: Oct. 20, 2026

(54) TUNING APPARATUS FOR MINIMUM DIVERGENCE ION BEAM

(71) Applicant: Axcelis Technologies, Inc., Beverly, MA (US)

(72) Inventors: Shu Satoh, Byfield, MA (US); Wilhelm Platow, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1316 days.

(21) Appl. No.: 17/348,031

(22) Filed: Jun. 15, 2021

(65) Prior Publication Data

US 2021/0398772 A1 Dec. 23, 2021

Related U.S. Application Data

(60) Provisional application No. 63/040,131, filed on Jun. 17, 2020.

(51) Int. Cl.
*H01J 37/317* (2006.01)
*H01J 37/09* (2006.01)
(Continued)

(52) U.S. Cl.
CPC .......... *H01J 37/3171* (2013.01); *H01J 37/09* (2013.01); *H01J 37/141* (2013.01); (Continued)

(58) Field of Classification Search
None
See application file for complete search history.

(56) References Cited

U.S. PATENT DOCUMENTS 6,501,078 B1 * 12/2002 Ryding .................. H01J 37/08 315/111.81
7,361,914 B2 4/2008 Rathmell
(Continued)

FOREIGN PATENT DOCUMENTS

CN 101901734 A * 12/2010
JP 2011519137 A 6/2011
(Continued)

OTHER PUBLICATIONS

International Search Report and Written Opinion mailed Sep. 30, 2021 in connection with PCT/US2021/037607.
(Continued)

*Primary Examiner* — James Choi
(74) *Attorney, Agent, or Firm* — Eschweiler & Potashnik, LLC

(57) ABSTRACT

An ion implantation system has an ion source configured to form an ion beam. A mass analyzer mass analyzes the ion beam, a scanning element scans the ion beam in a horizontal direction and a parallelizing lens translates the fanned-out scanned beam into parallel shifting scanning ion beam. For applications needing not only a mean incident angle, but highly-aligned ion incident angles and a tight angular distribution, a slit apparatus is positioned at horizontal and/or vertical front focal points of the parallelizing lens. Minimum horizontal and/or vertical angular distributions of the ion beam on the workpiece are attained by controlling a beam focusing lens upstream of the scanning element for the best beam transmission through the slit system.

16 Claims, 4 Drawing Sheets

(51) Int. Cl.

| | |
|---|---|
| ***H01J 37/141*** | (2006.01) |
| ***H01J 37/147*** | (2006.01) |
| ***H01J 37/153*** | (2006.01) |
| ***H01J 37/21*** | (2006.01) |

(52) U.S. Cl.

CPC ........ *H01J 37/1474* (2013.01); *H01J 37/153* (2013.01); *H01J 37/21* (2013.01); *H01J 2237/0451* (2013.01); *H01J 2237/0458* (2013.01); *H01J 2237/24585* (2013.01)

(56) References Cited

U.S. PATENT DOCUMENTS

| | | | | |
|---|---|---|---|---|
| 8,378,313 | B2 | 2/2013 | Eisner et al. | |
| 9,711,328 | B2 | 7/2017 | Satoh | |
| 10,037,877 | B1 | 7/2018 | Vanderberg | |
| 2008/0067442 | A1 * | 3/2008 | Vanderberg ......... | H01J 37/3171 250/492.21 |
| 2008/0142726 | A1 | 6/2008 | Relleen et al. | |
| 2008/0251713 | A1 * | 10/2008 | Tsukihara ............. | H01J 37/045 250/282 |
| 2009/0266997 | A1 * | 10/2009 | Tieger ................. | H01J 37/3171 250/424 |
| 2009/0314959 | A1 | 12/2009 | Gammel | |
| 2012/0248326 | A1 | 10/2012 | Eisner et al. | |
| 2014/0134833 | A1 | 5/2014 | Tsukihara et al. | |
| 2014/0353517 | A1 | 12/2014 | Kabasawa et al. | |
| 2015/0279612 | A1 | 10/2015 | Yagita | |
| 2015/0340197 | A1 | 11/2015 | Matsushita et al. | |
| 2015/0340202 | A1 | 11/2015 | Matsushita et al. | |
| 2015/0357160 | A1 | 12/2015 | Yagita et al. | |
| 2015/0371822 | A1 * | 12/2015 | Amano ................... | H01J 37/10 250/397 |
| 2019/0157035 | A1 * | 5/2019 | Sasaki ..................... | H01J 37/08 |

FOREIGN PATENT DOCUMENTS

| | | | | | |
|---|---|---|---|---|---|
| JP | 5345062 | B2 | | 11/2013 | |
| JP | 2014509778 | A | | 4/2014 | |
| JP | 2015191740 | A | | 11/2015 | |
| KR | 2006119331 | A | * | 11/2006 | ........... H01L 21/265 |
| TW | 201419366 | A | | 5/2014 | |
| TW | 201445609 | A | | 12/2014 | |
| TW | 201545197 | A | | 12/2015 | |
| TW | 201546866 | A | | 12/2015 | |
| TW | 201608596 | A | | 3/2016 | |

OTHER PUBLICATIONS

"Multimode ion implantation machine system and implantation regulating method" Public opening date Dec. 1, 2010.

Notice of First Review Opinion for Serial No. CN 2025091602381850, Issued on Sep. 16, 2025.

* cited by examiner

TUNING APPARATUS FOR MINIMUM DIVERGENCE ION BEAM

REFERENCE TO RELATED APPLICATIONS

This application claims the benefit of U.S. Provisional Application Ser. No. 63/040,131 filed Jun. 17, 2020, the contents of all of which are herein incorporated by reference in their entirety.

FIELD OF THE INVENTION

The present invention relates generally to ion implantation systems, and more specifically to systems and methods for controlling a beam angle of an ion beam in ion implantation systems.

BACKGROUND OF THE INVENTION

In the manufacture of semiconductor devices, ion implantation is used to dope semiconductors with impurities or dopants. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected extrinsic species to produce the desired semiconducting material. Implanting ions generated from source materials such as antimony, arsenic or phosphorus results in "n type" extrinsic material wafers, whereas if "p type" extrinsic material wafers are desired, ions generated with source materials such as boron, or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway can be evacuated to reduce the probability of ions being deflected from the predetermined beam path as a result of collisions with gas molecules.

Trajectories of charged particles of given kinetic energy in a magnetic field will differ for different masses (or charge-to-mass ratios) of these particles. Therefore, the part of an extracted ion beam which reaches a desired area of a semiconductor wafer or other target after passing through a constant magnetic field can be made pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

For some ion implantation systems, the physical size of the beam is smaller than a target workpiece, so the beam is scanned in one or more directions in order to adequately cover a surface of the target workpiece. Generally, an electrostatic or magnetic based scanner scans the ion beam in a fast direction and a mechanical device moves the target workpiece in a slow scan direction in order to provide sufficient cover.

Thereafter the ion beam is directed toward a target end station, which holds a target workpiece. Ions within the ion beam implant into the target workpiece, which is ion implantation. One important characteristic of ion implantation is that there exists a uniform angular distribution of ion flux across the surface of the target workpiece, such as a semiconductor wafer. The angular content of the ion beam defines implant properties through crystal channeling effects or shadowing effects under vertical structures, such as photoresist masks or CMOS transistor gates. A non-uniform angular distribution or angular content of the ion beam can lead to uncontrolled and/or undesired implant properties.

Angle correction is sometimes used when deflecting decel lenses are implemented in order to prevent the risk of energetic contamination. Energetic contamination can be considered the content of ions with a non-desired energy (typically higher than the desired energy), resulting in improper dopant placement in the workpiece, which can further cause undesired device performance or even device damage.

SUMMARY

The present disclosure thus provides an ion implantation system and method for minimizing an angular distribution (also called divergence) of an ion beam, such as when employing channeling through a crystal structure in a workpiece. Accordingly, accurate and expeditious tuning of the ion beam in achievable by the disclosed systems and methods, whereby a tight angular distribution of the ion beam can be attained with a removable slit at a front focal point of the last ion beam focusing element in a beam transport system.

Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

An ion implantation system has an ion source configured to form an ion beam. A mass analyzer mass analyzes the ion beam, a scanning element scans the ion beam in a horizontal direction and a parallelizing lens translates the fanning-out scanned beam into parallel shifting scanning ion beam. The present disclosure appreciates that, for some applications, it can be advantageous for ion trajectories to have highly aligned incident angles across a workpiece, as opposed to an averaged or mean incident angle across the workpiece, while also having a very tight angular distribution. Accordingly, a slit apparatus is positioned at one or more of a horizontal or vertical front focal point of a parallelizing lens. Minimum horizontal and/or vertical angular distributions of ion beam on the workpiece are further attained by adjusting or otherwise controlling a beam focusing lens (e.g., a quadrupole lens) upstream of the scanning element for the best beam transmission through the slit apparatus.

In accordance with one example aspect of the disclosure, an ion implantation system is provided for implanting ions into a workpiece. The ion implantation system, for example, comprises an ion source configured to form an ion beam and a mass analyzer configured to mass analyze the ion beam. A scanning element, for example, is configured to scan the ion beam in a horizontal direction, wherein the ion beam has a respective focal point in each of the horizontal direction and a vertical direction. A slit apparatus, for example, has an aperture selectively positioned downstream of the scanning element at one or more of the respective focal points of the ion beam in the horizontal direction and vertical direction. Further, parallelizing optics are provided downstream of the slit apparatus and configured to parallelize the ion beam, whereby an angular distribution in one or more of the horizontal direction and vertical direction is minimized.

In one example, the ion beam comprises a pencil beam or a spot beam. In another example, the slit apparatus comprises a plate having the aperture defined, therein. A translation apparatus, for example, can be further provided and configured to selectively position the plate, such as with respect to the ion beam. The translation apparatus, for example, can comprise a rotation apparatus configured to selectively rotate the plate into and out of a path of the ion beam. In another example, the translation apparatus comprises a linear translation apparatus configured to selectively linearly translate the plate into and out of the path of the ion beam. The scanning element, for example, is configured to provide a fanned-out scanned beam.

In another example, a quadrupole lens is provided upstream of the scanning element, wherein the scanning element is configured to provide an angular distribution of the ion beam in the horizontal direction and vertical direction. A controller is further provided and configured to control one or more of the scanning mechanism, the quadrupole lens, and a position of the aperture of the slit apparatus to maximize a beam current of the ion beam and to minimize the angular distribution of the ion beam at the workpiece. In another example, the controller is configured to control one or more of the ion source, mass analyzer, scanning element, slit apparatus, and parallelizing optics to maximize a beam current of the ion beam and minimize an angular distribution of the ion beam at the workpiece.

In accordance with another example aspect of the disclosure, an ion implantation system is provided, wherein the ion implantation system comprises an ion source configured to form an ion beam, a mass analyzer configured to mass analyze the ion beam, and a scanning element configured to scan the ion beam in a horizontal direction, wherein the ion beam has a respective focal point in each of the horizontal direction and a vertical direction. Parallelizing optics are provided downstream of the slit apparatus and configured to parallelize the ion beam, whereby the parallelizing optics define one or more of a vertical focal point and horizontal focal point upstream thereof, whereby an angular distribution in one or more of the horizontal direction and vertical direction is minimized. Further, a slit apparatus having an aperture is selectively positioned at one or more of a scan vertex of the scanning element and a vertical focal point of the ion beam.

The slit apparatus comprises, for example, comprises a plate having the aperture defined therein. A translation apparatus can be further configured to selectively position the plate. The translation apparatus, for example, can comprise a rotation apparatus configured to selectively rotate the plate into and out of a path of the ion beam. In an alternative example, the translation apparatus comprises a linear translation apparatus configured to selectively linearly translate the plate into and out of a path of the ion beam.

In another example, a quadrupole lens is positioned upstream of the slit apparatus, wherein the quadrupole lens is configured to provide horizontal and vertical focusing at the aperture to minimize an angular distribution of the ion beam in the respective horizontal direction and vertical direction. In another example, a controller is configured to control one or more of the quadrupole lens, the paralleling optics, and a position of the aperture of the slit apparatus to maximize a beam current of the ion beam and minimize the angular distribution of the ion beam at the workpiece.

In accordance with yet another aspect of the disclosure, a method is provided for minimizing an angular distribution of an ion beam. The method, for example, comprises focusing the ion beam at a focal point upstream of a corrector magnet. A slit is selectively positioned at the focal point of the ion beam. Further a quadrupole lens that is upstream of the slit is controlled, wherein a beam current of the ion beam is maximized and the angular distribution of the ion beam is minimized at the workpiece positioned downstream of the corrector magnet. Controlling the quadrupole lens, for example, independently alters a focal point to maximize a transmission of the ion beam through the slit.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
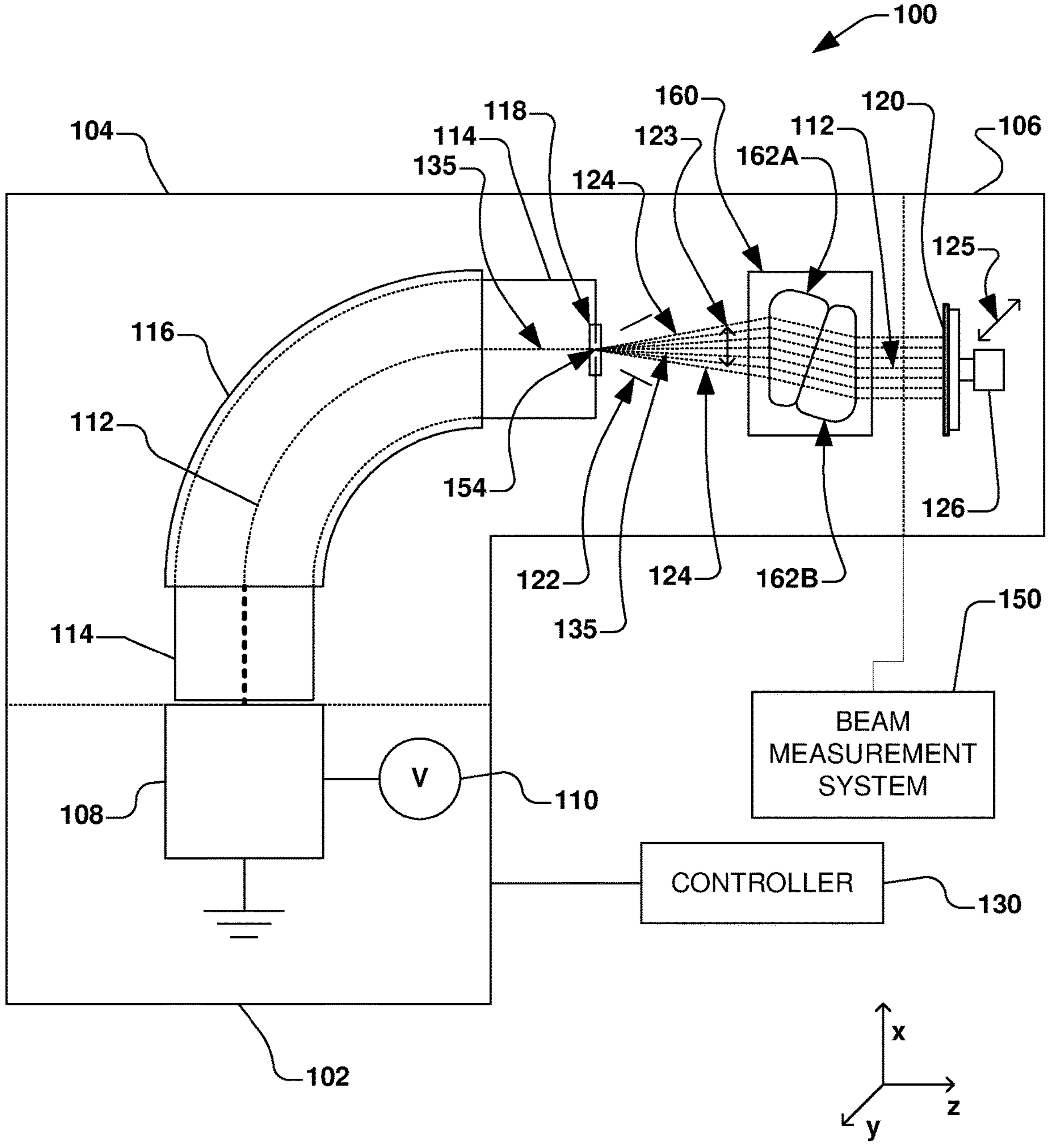
FIG. 1 illustrates an example ion implantation system in accordance with an aspect of the present disclosure.

The present disclosure provides an ion implantation system and method for controlling (e.g., minimizing) an angular distribution (e.g., a divergence) of an ion beam, such as when employing channeling through a crystal structure in a workpiece. Further, a system and method for accurately and expeditiously tuning the ion beam to attain a tight angular distribution of the ion beam are provided by implementing a removable slit at a front focal point of a downstream or last focusing element in an ion beam transport system.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

The present disclosure appreciates that, in order to achieve high degrees of channeling through a crystal lattice structure, especially at high energies, the ion beam should be angularly aligned with the crystal lattice structure of the workpiece. Various examples of channeling concepts and ion implantation systems are provided in co-owned U.S. Pat. No. 9,711,328 to Satoh, the entirety of which is hereby incorporated herein by reference.

The present disclosure further appreciates that such an alignment of the ion beam includes not only the mean or average angle of the ion beam with respect to the crystal lattice, but also its distribution. For example, for a very high energy arsenic (As) implant of greater than approximately 10 MeV, ions within the ion beam should have a tight angular distribution in order to provide a desirable channeling depth profile, such as having an angular distribution of less than approximately 0.1 degrees in standard deviation.

Conventionally, control of implant angles primarily concerned controlling the mean angle of incidence of the entire ion beam, and the distribution has not garnered much attention. However, with the recent rise in popularity of channeling implants, issues concerning the distribution of the implant angle have become more important, as well as how to reliably obtain an ion beam having a significantly small angle distribution.

Tuning an ion beam to provide a very small angle distribution has conventionally been a tedious process of trial-and-error; that is, repeating the cycle of changing parameters almost blindly, measuring the angle distribution of the resultant ion beam, and continuing the modification of parameters until an adequate distribution is attained. The present disclosure provides an expeditious solution to the conventional slow and unreliable tuning process for minimizing the angle distribution. The present disclosure provides a basis for tuning of vertical beam divergence in ion implantation systems, such as in the non-limiting example of the Purion XE/VXE/XEmax manufactured by Axcelis Technologies, Inc. of Beverly, Massachusetts.

In order to gain a better understanding of the present disclosure, an ion implantation system 100 is illustrated in FIG. 1 in accordance with various example aspects of the present disclosure. The ion implantation system 100 is presented for illustrative purposes and it is appreciated that aspects of the invention are not limited to the described ion implantation system and that other suitable ion implantation systems of varied configurations can also be employed.

The ion implantation system 100 is illustrated having a terminal 102, a beamline assembly 104, and an end station 106. The terminal 102, for example, comprises an ion source 108 powered by a high voltage power supply 110, wherein the ion source produces and directs an ion beam 112 through the beamline assembly 104, and ultimately, to the end station 106. The ion beam 112, for example, can take the form of a spot beam, pencil beam, ribbon beam, or any other shaped beam. The beamline assembly 104 further has a beamguide 114 and a mass analyzer 116, wherein a dipole magnetic field is established to pass only ions of appropriate charge-to-mass ratio through an aperture 118 at an exit end of the beamguide 114 to define a mass analyzed ion beam 135 directed toward a workpiece 120 (e.g., a semiconductor wafer, display panel, etc.) positioned in the end station 106.

In accordance with one example, an ion beam scanning system 122 (referred to generically as a "scanner" or "scanning element"), such as an electrostatic or electromagnetic scanner, is configured to scan the ion beam 112 in at least a first direction 123 (e.g., the +/−x-direction, also called a first scan path or "fast scan" axis, path, or direction) with respect to the workpiece 120, therein defining a ribbon-shaped ion beam or scanned ion beam 124 (e.g., a fanned-out scanned ion beam). Furthermore, in the present example, a workpiece scanning system 126 is provided, wherein the workpiece scanning mechanism is configured to selectively scan the workpiece 120 through the ion beam 112 in at least a second direction 125 (e.g., the +/−y-direction, also called a second scan path or "slow scan" axis, path, or direction). The ion beam scanning system 122 and the workpiece scanning system 126, for example, may be instituted separately, or in conjunction with one another, in order to provide the desired scanning of the workpiece relative to the ion beam 112. In another example, the ion beam 112 is electrostatically scanned in the first direction 123, therein producing the scanned ion beam 124, and the workpiece 120 is mechanically scanned in the second direction 125 through the scanned ion beam 124. Such a combination of electrostatic and mechanical scanning of the ion beam 112 and workpiece 120 produces what is called a "hybrid scan". The present invention is applicable to all combinations of scanning of the workpiece 120 relative to the ion beam 112, or vice versa.

Further, a controller 130 is provided, wherein the controller is configured to control one or more components of the ion implantation system 100.

According to one exemplary aspect of present disclosure, a beam measurement system 150 is further provided. The beam measurement system 150, for example, is configured to determine one or more properties associated with the ion beam 112. A system and method for measuring the angle of the ions incident to the workpiece 120, as well as a calibration of said measurement to the crystal planes of the workpiece has been provided in a so-called "Purion XE" ion implantation system and commonly-owned U.S. Pat. No. 7,361,914 to Robert D. Rathmell et al., the contents of which are hereby incorporated by reference in its entirety.

In this manner, the mass analyzer 116 allows those species of ions in the ion beam 112 which have the desired charge-to-mass ratio to pass there-through to define the mass analyzed ion beam 135 that exits through the aperture 118. While not shown, the mass analyzed ion beam 135, for example, is then accelerated to a desired energy and further focused by a beam focusing lens (e.g., a quadrupole lens) before entering the scanning element 122. The scanned ion beam 124 is then passed through a parallelizer 160 (e.g., a parallelizer/corrector component, also called a "corrector magnet"), which comprises two dipole magnets 162A, 162B in the illustrated example. The dipole magnets 162A, 162B, for example, are substantially trapezoidal and are oriented to mirror one another to cause the scanned ion beam 124 to bend into a substantially S-shape. Stated another way, the dipole magnets 162A, 162B have equal angles and radii and opposite directions of curvature.

The parallelizer 160, for example, causes the scanned ion beam 124 to alter its beam path such that the mass analyzed beam travels parallel to a beam axis regardless of the scan angle. As a result, the implantation angle is uniform across the workpiece 120. In one example, one or more of the parallelizers 160 also act as deflecting components, such that neutrals generated upstream of the parallelizers will not follow the nominal path, and thus have approximately zero probability of reaching the end station 106 and the workpiece 120.

It will be appreciated that the one or more so-called corrector magnets or parallelizers 160 may comprise any suitable number of electrodes or magnets arranged and biased to focus, bend, deflect, converge, diverge, scan, parallelize and/or decontaminate the ion beam 112. The end station 106 then receives the mass analyzed ion beam 135 which is directed toward the workpiece 120. It is appreciated that different types of end stations 106 may be employed in the ion implantation system 100. For example, a "batch" type end station can simultaneously support multiple workpieces 120 on a rotating support structure, wherein the workpieces are rotated through the path of the ion beam 112 until all the workpieces completely implanted. A "serial" type end station, on the other hand, supports a single workpiece 120 along the beam path for implantation, wherein multiple workpieces are implanted one at a time in serial fashion, with each workpiece being completely implanted before implantation of the next workpiece begins.

The end station 106 in the illustrated example of FIG. 1 is a "serial" type end station that supports the single workpiece along the beam path for implantation. The beam measurement system 150 may be further included in the end station 106 near the location of the workpiece 120 for calibration measurements prior to implantation operations. During calibration, the ion beam 112 passes through the beam measurement system 150. The beam measurement system 150, for example, includes one or more profilers that may be stationary or continuously traverse a profiler path, thereby measuring the profile of the ion beam 112 (e.g., scanned or un-scanned spot or pencil beam).

Ions within the ion beam 112 generally travel in the same direction with some degree of distribution (e.g., divergence) around a mean value of an angular distribution. Accordingly, the present disclosure contemplates that during ion implantation, a constant angle of incidence, i.e., a mean angle of the distribution, across the surface of the workpiece 120 is an important consideration. Moreover, the fidelity or tightness of the angular distribution of the ion beam, for example, defines implant properties through crystal channeling effects or shadowing effects under vertical structures, such as photoresist masks or CMOS transistor gates. Uncontrolled angular distribution of the ion beam 112, for example, leads to uncontrolled, and undesired implant properties.

The incident angle (mean angle of the distribution) and the angular distribution of the ion beam 112 is therefore measured to high accuracy using a variety of beam diagnostic equipment, some of which has have been discussed above. The measurement data may then be used in an angle correction method. Once the correction is applied, the measurement of beam angles and its adjustment are repeated until the desired beam angle properties, mean angle and tight distribution, is achieved.

Figure 2:
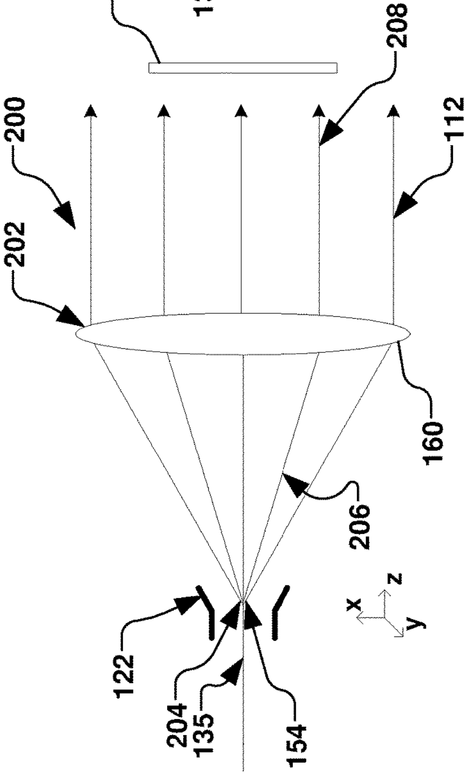
FIG. 2 is a schematic showing a finite beam angular distribution in accordance with an aspect of the present disclosure.

On some implantation systems, for example, the one or more corrector magnets or parallelizers 160 of FIG. 1 are utilized to convert a horizontally fanning-out beam into parallel shifting scanned beam. The parallelizing function, or optics, can be viewed as a positive focusing lens system 200 including parallelizing optics 202 (also called a parallelizing lens), as illustrated in FIG. 2. The parallelizing optics 202, for example, may comprise or be comprised of the corrector magnet or parallelizer 160 of FIG. 1. The parallelizing optics 202, for example, are configured to obtain a generally constant "mean" implant angle over the width of the workpiece 120. A front focal point 204, or the positive lens of the corrector magnet 160, for example, is located at the scan vertex 154 of the scanner or scanning element 122. As illustrated as an ideal case in FIG. 2, each line 206 of the ion beam 112 represents an ion beam 112 that has a "zero" angular distribution, or in other words, a substantially small angular distribution 208 of ion beams 112 in the horizontal direction (e.g., the x-direction shown in FIG. 2).

Figure 3:
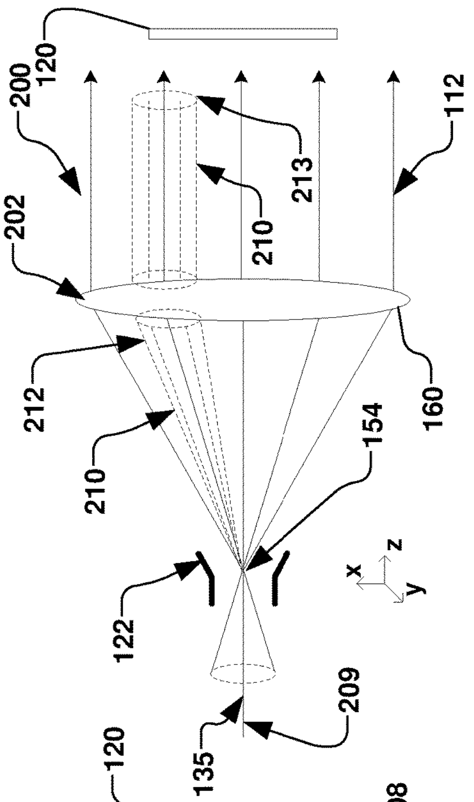
FIG. 3 is a schematic of a scanned ion beam illustrating angle of implantation in accordance with an aspect of the present disclosure.

FIG. 3 illustrates an example where an incoming ion beam 209 (e.g., the mass analyzed ion beam 135) has a finite angular distribution 210. In such an instance, when the incoming ion beam 209 having the finite angular distribution 210 is focused to the same scan vertex position (shown as a cone 212 emanating from the scan vertex 154 in FIG. 3), a final ion beam 213 on to the workpiece 120 also has the finite angular distribution 210. The degree of angular distribution of the final ion beam 213 depends on how well the incoming ion beam 209 is focused at the scan vertex 154.

Figure 4:
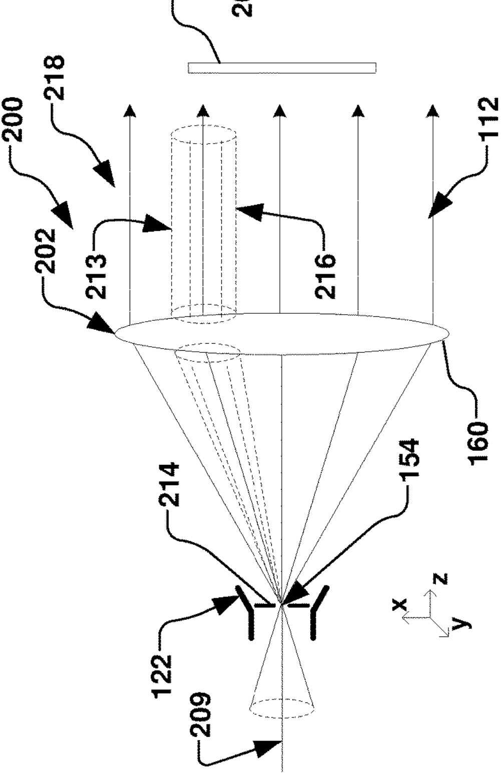
FIG. 4 is a schematic of a scanned ion beam illustrating angle of implantation incorporating a slit for horizontal divergence in accordance with an aspect of the present disclosure.

In accordance with the present disclosure, FIG. 4 illustrates one example, whereby a slit 214 (e.g., a slit defined in a retractable plate having an aperture configured such that operation of the scanning element 122 is possible) is placed at the scan vertex 154, whereby various lenses upstream of the scanning element are adjusted or otherwise controlled to focus or otherwise provide a maximum transmission of the incoming ion beam 209 through the slit. As such, the ion beam 112 has a lowest angle distribution 216 on to the workpiece 120. In accordance with the present disclosure, FIG. 4 thus illustrates a horizontal angle distribution minimization system 218. While various technical issues are understood to exist in designing the slit 214 illustrated in FIG. 4, such as being retractable at the scan vertex 154, while also providing operation of the scanning element 122 during normal operation of the ion implantation system in a high voltage environment, the present disclosure contemplates such a system as providing desirable minimization of angle distribution of the ion beam 112.

Figure 5:
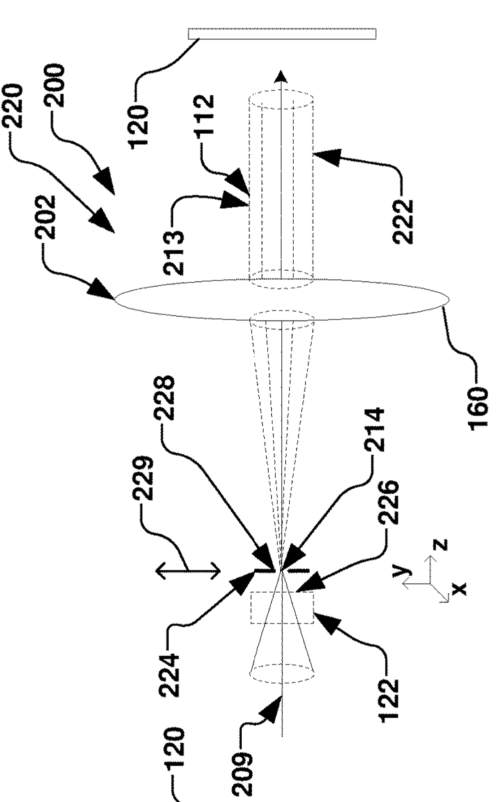
FIG. 5 is a schematic of a scanned ion beam illustrating a vertical divergence slit in accordance with an aspect of the present disclosure.

FIG. 5 illustrates an example of a vertical angle distribution minimization system 220. In the vertical direction (e.g., in the y-direction shown in FIG. 5), the corrector magnet 160, for example, is configured to provide a strong positive focusing power, whereby the corrector magnet can be utilized to minimize a vertical beam angle distribution 222 using a similar principle as that used in the horizontal direction, as discussed above. The present disclosure thus provides a Vertical Divergence Slit (VDS) apparatus 224 (also called a retractable slit apparatus), for the minimization of the vertical beam angle distribution 222. The VDS apparatus 224, in one example, is located immediately after an exit 226 of the scanning element 122, which is also close in proximity to the front focal point of the lens of corrector magnet 160 in the vertical direction. The focusing power of the corrector magnet 160 (e.g., a so-called "S-bend"), for example, is strong enough for the slit 214 of the VDS apparatus 224 to be placed at the exit 226 of the scanning element 122 at a focal point 228, thereof. The VDS apparatus 224, for example, is selectively removable from the path of the ion beam 112, whereby the slit 214 of the VDS apparatus can be selectively translated, rotated, or otherwise moved or removed from the path of the ion beam, as indicated in one example by arrows 229. The slit 214 of the VDS apparatus 224, for example, is configured to be selectively positioned, translated and/or rotated along or about any of the x-axis, y-axis, or z-axis.

It should be noted that while particular ion implantations are specifically discussed herein, other ion implantation systems, for example, may utilize a similar system as that discussed above in order to minimize the angle distribution of the final beam, in either of the horizontal or vertical direction, whereby a slit is provided at the front focal point of the final positive lens in the respective horizontal or vertical direction.

In one example, the VDS apparatus 224 is provided after the scanning element 122 because the vertical focal length is stronger, and as such, the slit 214 is located closer to the corrector magnet 160. Tuning of the ion beam 112, for example, can thus be provided before or after the scanning element 122, such as via a quadrupole lens (not shown), whereby the slit 214 is moved away after tuning, and whereby ion implantation into the workpiece 120 can be subsequently performed. When tuning, the slit 214 is positioned along the beamline, and an upstream lens (not shown) can be adjusted and focused point-wise. The beam current of the ion beam 112 can then be measured such that the transmission through the slit 214 is the optimized (e.g., yielding a maximized beam current), thus providing an indication that the ion beam is quite small through the slit. Thus, the present disclosure provides an angle distribution control tuning aid.

Figure 6A:
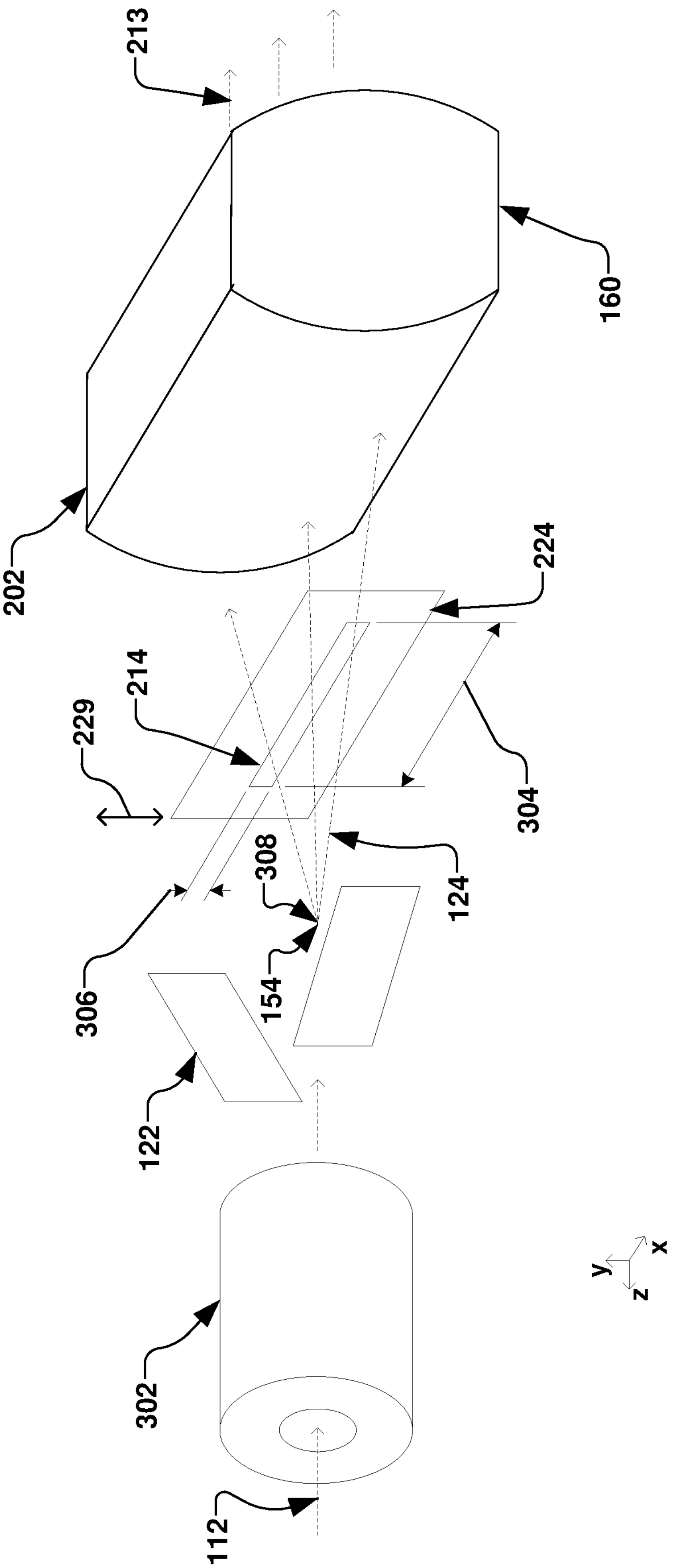
FIG. 6A is a simplified perspective view of an example vertical divergence slit apparatus for controlling an angle of implantation in accordance with an aspect of the present disclosure.
Figure 6B:
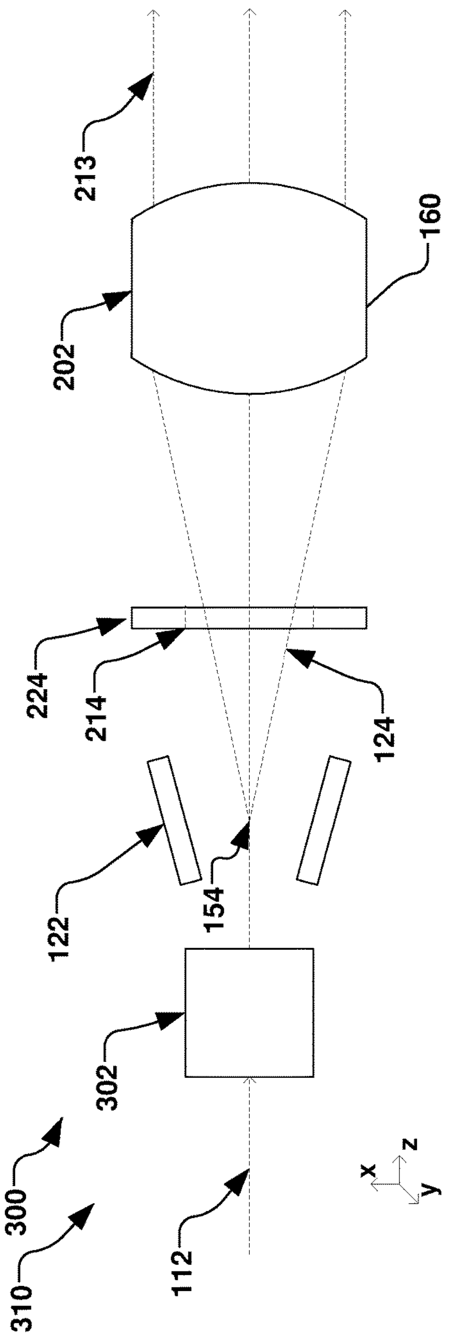
FIG. 6B is a top view of an example vertical divergence slit apparatus in accordance with another aspect of the present disclosure.
Figure 6C:
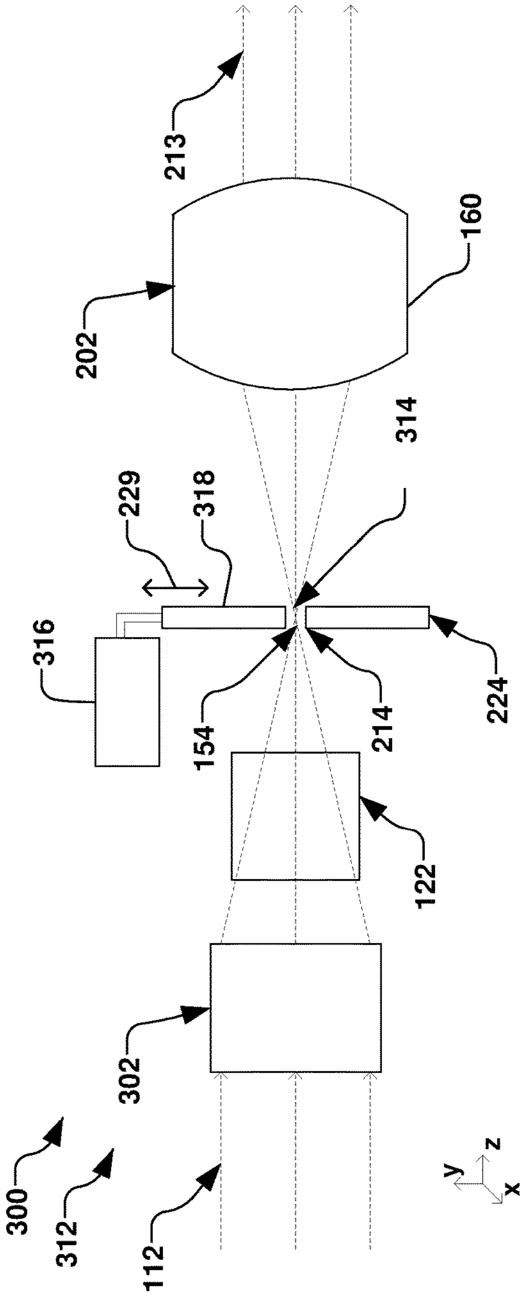
FIG. 6C is a side view of the vertical divergence slit apparatus of FIG. 6B in accordance with yet another aspect of the present disclosure.

FIGS. 6A-6C illustrate another example of a vertical angle distribution minimization system 300 in accordance with various aspects of the present disclosure. As an overview, FIG. 6A illustrates the vertical angle distribution minimization system 300, whereby the ion beam 112 is passed through a quadrupole lens 302 and subsequently scanned in the horizontal direction (e.g., the x-direction) by the scanning element 122. The VDS apparatus 224, for example, is selectively positioned (e.g., indicated by arrows 229) such that a horizontal dimension 304 and vertical dimension 306 of the slit 214 primarily restricts only a vertical height (e.g., in the y-direction) of the scanned ion beam 124 while permitting the entire scan width of the ion beam 112 in the horizontal direction to pass therethrough. The scan vertex 154, for example, is coincident with a horizontal front focal point 308 of the parallelizing optics 202.

FIG. 6B illustrates a top view 310 of the vertical angle distribution minimization system 300 of FIG. 6A, whereby the scanned ion beam 124 is not impeded in the horizontal direction by the slit 214 of the VDS apparatus 224. The scan vertex 154, or the horizontal bending point of the scanning element 122, is placed at the horizontal front focal point 308 of the parallelizing optics 202. For illustration purposes, the parallelizing optics 202 is depicted as a simple positive focusing lens, however other lens systems are also contemplated. The quadrupole lens 302, for example, brings the ion beam 112 into focus at the scan vertex 154, whereby the final ion beam 213 out of the parallelizing optics 202 is horizontally parallel and has the minimum angular distribution.

FIG. 6C shows a side view 312 of the vertical angle distribution minimization system 300 of FIG. 6A, wherein the slit 214 of the VDS apparatus 224 is positioned (e.g., illustrated as arrows 229) at a vertical front focal point 314 of the parallelizing optics 202, when the quadrupole lens 302 focuses the ion beam 112 vertically at the VDS slit. It is to be appreciated that the VDS apparatus 224, for example, may comprise a translation apparatus 316 comprising one or more linear actuators, rotational actuators, gears, linkages, and/or other mechanisms operatively coupled to a plate 318 in which the slit 214 is defined, as well as one or more controllers or other control mechanisms, whereby the VDS apparatus is configured to selectively position the slit 214 at the vertical front focal point 314 and scan vertex 154. Accordingly, the final ion beam 213 emerging from the parallelizing optics 202 is advantageously vertically parallel, while also having the minimum angular distribution in vertical direction, as described above. The VDS apparatus 224 may be further removed from the path of the ion beam 112, as desired.

Thus, the present disclosure provides advantages over the conventional iterative trial-and-error process, thus quickly achieving a faster and easier tuning of the ion implantation system in real time.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. The term “exemplary” as used herein is intended to imply an example, as opposed to best or superior. Furthermore, to the extent that the terms “including”, “includes”, “having”, “has”, “with”, or variants thereof are used in either the detailed description and the claims, such terms are intended to be inclusive in a manner similar to the term “comprising”.

What is claimed is:

1. An ion implantation system for implanting ions into a workpiece, the ion implantation system comprising:
   an ion source configured to form an ion beam;
   a beamguide comprising a mass analyzer configured to mass analyze the ion beam and a mass resolving aperture configured to pass only ions of a predetermined charge-to-mass ratio therethrough;
   a scanning element configured to scan the ion beam from a scan vertex in a horizontal direction;
   parallelizing optics positioned downstream of the scanning element and configured to parallelize the ion beam;
   a translation apparatus; and
   a slit apparatus positioned downstream of the mass resolving aperture and comprising a plate having an aperture of fixed horizontal and vertical dimensions, wherein the translation apparatus is configured to selectively position the plate to position the aperture at each of (i) the scan vertex of the scanning element and (ii) a vertical focal point of the ion beam upstream of the parallelizing optics, whereby an angular distribution of the ion beam in each of the horizontal direction and a vertical direction is respectively minimized.

2. The ion implantation system of claim 1, wherein the ion beam comprises a pencil beam or a spot beam.

3. The ion implantation system of claim 1, further comprising a translation apparatus configured to selectively position the plate.

4. The ion implantation system of claim 3, wherein the translation apparatus comprises a rotation apparatus configured to selectively rotate the plate into and out of a path of the ion beam.

5. The ion implantation system of claim 3, wherein the translation apparatus comprises a linear translation apparatus configured to selectively linearly translate the plate into and out of a path of the ion beam.

6. The ion implantation system of claim 1, wherein the scanning element is configured to define a fanned-out scanned beam.

7. The ion implantation system of claim 1, further comprising:
   a quadrupole lens upstream of the scanning element; and
   a controller configured to control one or more of the scanning element, the quadrupole lens, and a position of the aperture of the slit apparatus to maximize a beam current of the ion beam and minimize the angular distribution of the ion beam at the workpiece.

8. The ion implantation system of claim 1, further comprising a controller configured to control one or more of the ion source, the mass analyzer, the scanning element, the slit apparatus, and the parallelizing optics to maximize a beam current of the ion beam and minimize the angular distribution of the ion beam at the workpiece.

9. An ion implantation system for implanting ions into a workpiece, the ion implantation system comprising:
   an ion source configured to form an ion beam;
   a beamguide comprising a mass analyzer configured to mass analyze the ion beam and a mass resolving aperture configured to pass only ions of a predetermined charge-to-mass ratio therethrough;
   a scanning element configured to scan the ion beam from a scan vertex in a horizontal direction;
   parallelizing optics downstream of the scanning element and configured to parallelize the ion beam, whereby the parallelizing optics define one or more of a vertical focal point of the ion beam in a vertical direction and a horizontal focal point of the ion beam in the horizontal direction, wherein the vertical focal point and horizontal focal point are upstream of the parallelizing optics;
   a translation apparatus; and
   a slit apparatus positioned downstream of the mass resolving aperture and comprising a plate having an aperture defined therein, wherein the aperture has fixed horizontal and vertical dimensions, and wherein the translation apparatus is configured to selectively position the plate to selectively position the aperture at each of the scan vertex and the vertical focal point of the ion beam, whereby an angular distribution of the ion beam in both of the horizontal direction and vertical direction is minimized.

10. The ion implantation system of claim 9, wherein the ion beam comprises a pencil beam or a spot beam.

11. The ion implantation system of claim 9, further comprising a translation apparatus configured to selectively position the plate.

12. The ion implantation system of claim 11, wherein the translation apparatus comprises a rotation apparatus configured to selectively rotate the plate into and out of a path of the ion beam.

13. The ion implantation system of claim 11, wherein the translation apparatus comprises a linear translation apparatus configured to selectively linearly translate the plate into and out of a path of the ion beam.

14. The ion implantation system of claim 9, wherein the scanning element is configured to provide a fanned-out scanned beam.

15. The ion implantation system of claim 9, further comprising a quadrupole lens positioned upstream of the slit apparatus, wherein the quadrupole lens is configured to provide horizontal and vertical focusing at the aperture to minimize the angular distribution of the ion beam in the respective horizontal direction and vertical direction.

16. The ion implantation system of claim 15, further comprising a controller, wherein the controller is configured to control one or more of the quadrupole lens, the parallelizing optics, and a position of the aperture of the slit apparatus to maximize a beam current of the ion beam and minimize the angular distribution of the ion beam at the workpiece.

* * * * *